United States Patent
Frohberg et al.

(10) Patent No.: US 7,932,166 B2
(45) Date of Patent: Apr. 26, 2011

(54) FIELD EFFECT TRANSISTOR HAVING A STRESSED CONTACT ETCH STOP LAYER WITH REDUCED CONFORMALITY

(75) Inventors: Kai Frohberg, Niederau (DE); Frank Feustel, Dresden (DE); Thomas Werner, Reichenberg (DE)

(73) Assignee: Advanced Micro Devices, Inc., Austin, TX (US)

( * ) Notice: Subject to any disclaimer, the term of this patent is extended or adjusted under 35 U.S.C. 154(b) by 638 days.

(21) Appl. No.: 11/693,215

(22) Filed: Mar. 29, 2007

(65) Prior Publication Data
US 2008/0054314 A1      Mar. 6, 2008

(30) Foreign Application Priority Data
Aug. 31, 2006 (DE) .................. 10 2006 040 765

(51) Int. Cl.
*H01L 21/3205* (2006.01)
*H01L 21/4763* (2006.01)
(52) U.S. Cl. ........ 438/586; 438/240; 438/289; 438/303; 438/525; 257/E21.252; 257/E21.577
(58) Field of Classification Search .............. 438/585, 438/586, 289, 525, 253, 240, 303; 257/E21.252, 257/E21.577
See application file for complete search history.

(56) References Cited

U.S. PATENT DOCUMENTS

| 7,052,946 B2 | 5/2006 | Chen et al. ............. 438/199 |
| 2005/0158955 A1* | 7/2005 | Yang et al. ............. 438/282 |
| 2007/0096220 A1* | 5/2007 | Kim et al. ............. 257/382 |
| 2008/0122003 A1* | 5/2008 | Fang et al. ............. 257/369 |

FOREIGN PATENT DOCUMENTS
EP      1 717 864 A1      11/2006

OTHER PUBLICATIONS
Widmann et al., "Technologie hochintegrierter Schaltungen," p. 315.
* cited by examiner

*Primary Examiner* — Matthew S Smith
*Assistant Examiner* — John M Parker
(74) *Attorney, Agent, or Firm* — Williams, Morgan & Amerson, P.C.

(57) ABSTRACT

By forming a highly non-conformal stressed overlayer, such as a contact etch stop layer, the efficiency of the stress transfer into the respective channel region of a field effect transistor may be significantly increased. For instance, non-conformal PECVD techniques may be used for forming highly stressed silicon nitride in a non-conformal manner, thereby achieving higher transistor performance for otherwise identical stress conditions.

22 Claims, 6 Drawing Sheets

FIELD EFFECT TRANSISTOR HAVING A STRESSED CONTACT ETCH STOP LAYER WITH REDUCED CONFORMALITY

BACKGROUND OF THE INVENTION

1. Field of the Invention

Generally, the present disclosure relates to the field of integrated circuits, and, more particularly, to the manufacture of field effect transistors having a strained channel region.

2. Description of the Related Art

Integrated circuits typically comprise a large number of circuit elements on a given chip area according to a specified circuit layout, wherein, in complex circuits, the field effect transistor represents one important component. Generally, a plurality of process technologies are currently practiced, wherein, for complex circuitry based on field effect transistors, such as microprocessors, storage chips and the like, CMOS technology is currently one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The shrinkage of the transistor dimensions, however, involves a plurality of issues associated therewith that have to be addressed so as to not unduly offset the advantages obtained by steadily decreasing the channel length of MOS transistors. One problem in this respect is the development of enhanced photolithography and etch strategies to reliably and reproducibly create circuit elements of critical dimensions, such as the gate electrode of the transistors, for a new device generation. Moreover, highly sophisticated dopant profiles, in the vertical direction as well as in the lateral direction, are required in the drain and source regions to provide low sheet and contact resistivity in combination with a desired channel controllability.

Since the continuous size reduction of the critical dimensions, i.e., the gate length of the transistors, necessitates the adaptation and possibly the new development of process techniques concerning the above-identified complex process steps, it has been proposed to enhance device performance of the transistor elements not only by reducing the transistor dimensions but also by increasing the charge carrier mobility in the channel region for a given channel length. In principle, at least two mechanisms may be used, in combination or separately, to increase the mobility of the charge carriers in the channel region. First, the dopant concentration within the channel region may be reduced, thereby reducing scattering events for the charge carriers and thus increasing the conductivity. However, reducing the dopant concentration in the channel region significantly affects the threshold voltage of the transistor device, while the reduced channel length may even require enhanced dopant concentrations in order to control short channel effects, thereby making a reduction of the dopant concentration a less attractive approach unless other mechanisms are developed to adjust a desired threshold voltage.

Second, the lattice structure in the channel region may be modified, for instance by creating tensile or compressive strain therein, which results in a modified mobility for electrons and holes, respectively. For example, creating tensile strain in the channel region of a silicon layer having a standard crystallographic configuration may increase the mobility of electrons, which, in turn, may directly translate into a corresponding increase in the conductivity for N-type transistors. On the other hand, compressive strain in the channel region may increase the mobility of holes, thereby providing the potential for enhancing the performance of P-type transistors.

Consequently, it has been proposed to introduce, for instance, a silicon/germanium layer or a silicon/carbon layer in or below the channel region to create tensile or compressive stress. Although the transistor performance may be considerably enhanced by the introduction of strain-creating layers in or below the channel region, significant efforts have to be made to implement the formation of corresponding strain-inducing layers into the conventional and well-approved CMOS technique. For instance, additional epitaxial growth techniques have to be developed and implemented into the process flow to form the germanium- or carbon-containing stress layers at appropriate locations in or below the channel region. Hence, process complexity is significantly increased, thereby also increasing production costs and the potential for a reduction in production yield.

Therefore, a technique is frequently used that enables the creation of desired stress conditions within the channel region of different transistor elements by modifying the stress characteristics of a contact etch stop layer that is formed above the basic transistor structure in order to form contact openings to the gate and drain and source terminals in an interlayer dielectric material. The effective control of mechanical stress in the channel region, i.e., effective stress engineering, may be accomplished by individually adjusting the internal stress in the contact etch stop layer in order to position a contact etch contact layer having an internal compressive stress above a P-channel transistor while positioning a contact etch stop layer having an internal tensile stress above an N-channel transistor, thereby creating compressive and tensile strain, respectively, in the respective channel regions.

Typically, the contact etch stop layer is formed by plasma enhanced chemical vapor deposition (PECVD) processes with a moderately high degree of conformality above the transistor, i.e., above the gate structure and the drain and source regions, wherein, for instance, silicon nitride may be used due to its high etch selectivity with respect to silicon dioxide, which is a well-established interlayer dielectric material. Furthermore, PECVD silicon nitride may be deposited with a high intrinsic stress, for example, up to 2 Giga Pascal (GPa) or significantly higher of tensile or compressive stress, wherein the type and the magnitude of the intrinsic stress may be efficiently adjusted by selecting appropriate deposition parameters. For example, ion bombardment, deposition pressure, substrate temperature, gas components and the like represent respective parameters that may be used for obtaining the desired intrinsic stress. Since the contact etch stop layer is positioned close to the transistor, the intrinsic stress may be efficiently transferred into the channel region, thereby significantly improving the performance thereof. Furthermore, the process may not significantly contribute to process complexity, contrary to other approaches, which may require epitaxial growth techniques and the like. Moreover, for advanced applications, the strain-inducing contact etch stop layer may be efficiently combined with other strain-inducing mechanisms, such as strained or relaxed semiconductor materials that are incorporated at appropriate transistor areas in order to also create a desired strain in the channel region. Consequently, the stressed contact etch stop layer is a well-established design feature for advanced semiconductor devices, wherein, however, a further performance enhancement may require significant efforts in developing improved PECVD processes for even further increasing the magnitude of intrinsic stress.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein is directed to a technique for forming field effect transistors having a strained channel region by providing at least one strain-inducing source in the form of a stressed overlayer formed above the respective transistor element, which, in some illustrative embodiments, may be provided in the form of a contact etch stop layer, wherein the stressed material of the overlayer may be positioned more closely to the channel region, thereby significantly increasing the efficiency of the strain-inducing mechanism compared to conventional devices for otherwise identical stress conditions. For this purpose, the respective stressed overlayer may be provided with a high degree of non-conformality, thereby increasing the amount of stressed material positioned above horizontal areas of the drain and source regions, which may thus increase the stress transfer mechanism. Furthermore, in other illustrative embodiments, the more pronounced surface topography provided by the non-conformal deposition of the stressed overlayer may be reduced or compensated for by a respective planarization step during or after forming a corresponding interlayer dielectric material above the stressed overlayer. Consequently, the stressed overlayer may be provided as a highly efficient strain-inducing mechanism without unduly contributing to further process complexity, thereby providing the potential for omitting other strain-inducing mechanisms of increased process complexity, such as strained semiconductor materials in the drain and source regions or in the channel region, or the subject matter disclosed herein may be advantageously combined with other strain-inducing sources, thereby more efficiently enhancing the overall performance of the respective transistor.

According to one illustrative embodiment disclosed herein, a method comprises depositing a stress-inducing layer having a first material composition above a gate electrode structure having a dielectric sidewall portion and above drain and source regions of a field effect transistor by a non-conformal deposition process, wherein the non-conformal deposition process produces a conformality of approximately 70% or less with respect to the dielectric sidewall portion and a top surface of the gate electrode structure. Furthermore, an interlayer dielectric material of a second material composition other than the first material composition is formed above the stress-inducing layer.

According to another illustrative embodiment disclosed herein, a method comprises forming a first non-conformal stress layer above a first transistor, wherein the first non-conformal stress layer has a first type of intrinsic stress. Furthermore, the method comprises forming a second non-conformal stress layer above a second transistor, wherein the second non-conformal stress layer has a second type of intrinsic stress other than the first type of intrinsic stress.

According to yet another illustrative embodiment disclosed herein, a semiconductor device comprises a gate electrode formed above a channel region and a dielectric sidewall structure formed on sidewalls of the gate electrode. Drain and source regions are located to enclose the channel region. Furthermore, the device comprises a stress layer formed above the gate electrode, the dielectric sidewall structure and the drain and source regions, wherein the stress layer has a first thickness above the gate electrode and a second thickness at the dielectric sidewall structure and wherein the second thickness is less than the first thickness. Furthermore, an interlayer dielectric material is formed on the stress layer and has a material composition other than the stress layer.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to transistor devices having a stressed overlayer, such as a contact etch stop layer and the like, for inducing a significant strain in the respective channel region. For this purpose, appropriate well-established deposition techniques may be used for the fabrication of the stressed overlayer such that the respective stressed material having the highest effect with respect to the finally obtained strain may be provided in an increased amount, that is, the respective material may be positioned, in addition to areas also covered by conventional techniques, at areas that are located more closely to the channel region. Thus, for otherwise given stress conditions, i.e., a given transistor configuration, which may include possible other strain-inducing sources, such as embedded strained semiconductor materials and the like, and for a given manufacturing sequence, a significant increase of the transistor performance may be accomplished substantially without contributing to process complexity compared to standard manufacturing techniques. Consequently, the subject matter disclosed herein is highly advantageous in the context of scaled semiconductor devices comprising field effect transistors having a gate length of 90 nm and significantly less, for example, 50 nm and less.

Figure 1A:
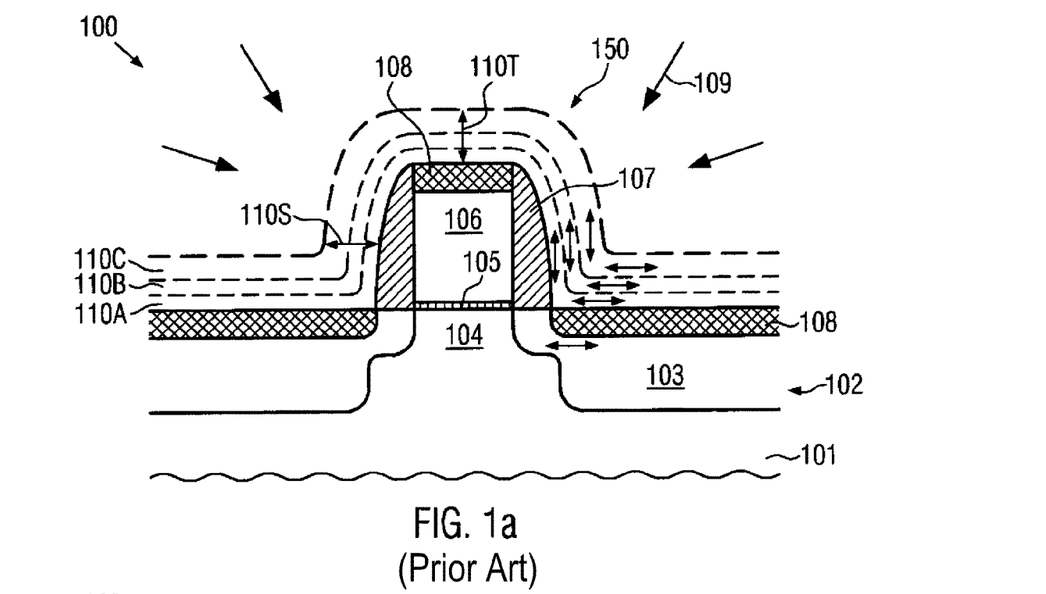
FIG. 1a schematically illustrates a cross-sectional view of a transistor during a substantially conformal deposition process for forming a contact etch stop layer according to conventional strategies.

FIG. 1a schematically illustrates a cross-sectional view of a semiconductor device 100 comprising, at this manufacturing stage, a field effect transistor 150, which may represent an N-channel transistor or a P-channel transistor. The device 100 may comprise a substrate 101, which may represent any appropriate carrier material for forming thereon and therein the transistor 150. For example, the substrate 101 may represent a semiconductor bulk substrate having formed thereon an appropriate semiconductor layer 102, such as a silicon layer, which may include other material components in order to obtain the desired device characteristics in view of conductivity, strain and the like. For instance, the semiconductor layer 102 may comprise germanium, carbon and other appropriate materials for adjusting the strain conditions in the layer 102. It should be appreciated that dopant species may also be incorporated at specified portions in the layer 102 in order to provide the corresponding conductivity characteristics. The substrate 101 may also represent a silicon-on-insulator (SOI) substrate, in which a buried insulating layer (not shown) may be provided, above which is formed the semiconductor layer 102. Consequently, although not explicitly shown, the embodiments described herein may refer to a bulk transistor configuration and may also refer to an SOI architecture, unless otherwise specifically set forth in the description and/or the appended claims.

Respective drain and source regions 103 may be defined in the semiconductor layer 102 on the basis of an appropriately designed dopant profile, thereby defining a respective channel region 104 between the respective drain and source regions 103. A gate insulation layer 105, which may be comprised of any appropriate material, may be formed above the channel region 104 in order to separate a gate electrode 106 from the channel region 104. The gate electrode 106 may have a gate length, i.e., in FIG. 1a the horizontal dimension of the gate electrode 106, of approximately 90 nm and even significantly less for highly advanced field effect transistors. For instance, the length of the gate electrode 106 may be 50 nm and less for semiconductor devices of the 90 nm technology node. Furthermore, a dielectric portion or structure 107, also referred to as sidewall spacers, may be formed at sidewalls of the gate electrode 106. Moreover, at this manufacturing stage, respective metal silicide regions 108 may be provided in the drain and source regions 103 and on top of the gate electrode 106. For instance, nickel, cobalt, platinum or any other refractory metals and combinations thereof may be used as components of the respective metal silicide regions 108.

The semiconductor device 100 as shown in FIG. 1a may be formed in accordance with the following processes. After forming respective isolation structures (not shown), such as shallow trench isolations and the like, within the semiconductor layer 102, respective dopant profiles may be established in the respective layer portions to define the type of transistor, the respective threshold voltages and the like. Next, the gate electrode 106 and the gate insulation layer 105 may be formed on the basis of well-established techniques including sophisticated oxidation and/or deposition techniques in combination with advanced lithography and etch processes. Thereafter, the drain and source regions 103 may be formed by ion implantation, wherein, depending on device and process requirements, portions of the sidewall spacer 107 may be formed intermediately with respective implantation processes in order to obtain the desired lateral profile of the drain and source regions 103. Respective anneal processes may be performed in combination with the implantation sequence at any appropriate manufacturing stage. Furthermore, the metal silicide regions 108 may be formed on the basis of any well-established technique, wherein the sidewall spacer structure 107 may be used as a silicidation mask. As previously explained, in sophisticated applications, it is highly desirable to create a respective strain in the channel region 104, which may be accomplished on the basis of a plurality of stress-inducing sources, of which one efficient type is a highly stressed layer formed above the transistor 150. In other cases, additional other strain-inducing sources, such as a strained semiconductor material in the drain and source regions (not shown), may be provided and/or a strained or relaxed semiconductor material may be provided in the channel region 104 in order to respectively increase the charge carrier mobility therein. For instance, a high degree of uniaxial strain in the channel region 104, that is, a strain substantially oriented in the horizontal direction of FIG. 1a, may significantly increase the charge carrier mobility when the type of strain is adjusted to the conductivity of the type of transistor 150.

When strain is to be efficiently induced in the channel region 104 by a stressed overlayer, the magnitude of intrinsic stress, the distance and the amount of stress material with respect to the channel region 104 may represent important aspects for maintaining a high degree of strain in the region 104. Consequently, the contact etch stop layer that is typically provided for controlling a respective etch process for forming contact openings in a respective interlayer dielectric material may represent a viable material layer since it has to be deposited close to the drain and source regions 103, thereby imparting a desired degree of strain therein, which may also be transferred into the channel region 104. Furthermore, the respective stress may also act on the sidewall spacer structure 107 so as to also induce a respective strain component in the channel region 104. For these reasons, appropriate deposition recipes have been developed with respect to silicon nitride, which is a frequently used etch stop material, in order to generate a high degree of intrinsic stress. In FIG. 1a, a respective deposition process 109 is illustrated, which is performed on the basis of conventional recipes in order to obtain an etch stop layer, which according to conventional technical practice is to be provided with a high degree of conformality, while additionally a high magnitude of intrinsic stress is to be provided. Due to the restricted thermal budget in the formation of highly scaled transistor devices, typically PECVD techniques are used for forming the corresponding contact etch stop layer, since here the required material characteristics may be obtained at significantly lower temperatures compared to, for instance, thermal chemical vapor deposition (CVD) processes. Thus, PECVD silicon nitride is frequently used as an efficient etch stop layer, wherein respective process recipes have been developed to provide a high degree of conformality, although PECVD techniques exhibit per se a reduced degree of conformal behavior compared to high temperature driven CVD processes. For instance, important aspects of the plasma-driven process are the non-equilibrium low temperature gas phase chemical reactions generating radical and ion reactive species in the plasma discharge, and the flux and energy of the respective species when impinging on the surface of the layer being deposited. In particular, the ion bombardment caused by the ionic species in the plasma-based deposition ambient, which controls the surface mobility of the precursor material, is a dominant factor in determining the finally obtained composition of the layer, the density thereof, the intrinsic stress and the finally obtained step coverage or conformality. Thus, the conventional process 109 is based on respective process parameters for controlling the ion bombardment and additionally the composition of the gaseous ambient and the temperature and pressure therein in order to obtain a high intrinsic strain in combination with a high degree of conformality.

FIG. 1a illustrates various phases of the highly conformal process 109, wherein respective layer portions of a layer 110, indicated as 110A to 110C, are shown in order to schematically illustrate the progression of the deposition process 109 for forming a respective silicon nitride layer 110 having a high degree of conformality and intrinsic stress. In this respect, conformality is to be understood as the capability of forming a layer having substantially uniform (as described more fully below) thickness on an underlying structured surface. In the context of the present disclosure, the conformality of the layer 110 may be expressed as the ratio of a thickness 110S, taken at the dielectric sidewall portion 107 of the gate electrode 106 at a height that substantially corresponds to the height of the horizontal portions of the layer 110 located above the respective drain and source regions 103, with respect to a thickness 110T, taken at the top of the gate electrode 106. In this sense, the layer 110 may be considered herein as being substantially conformal, when the thickness 110S is approximately 80% or more, or approximately 120% or less of the thickness 110T. Similarly, a stressed overlayer, such as the contact etch stop layer 110, may be considered as a non-conformal layer when the respective thickness 110S is approximately 0.7 or less times the thickness 110T.

As shown, the layer portions 110A to 110C may represent the corresponding layer thickness at successive time periods of the deposition process 109, wherein each sub-layer 110A, 110B and 110C may provide a respective stress upon deposition on the underlying material. For instance, for the first sub-layer 110A, the silicon nitride material may be deposited on the drain and source regions 103, i.e., in this example, on the respective metal silicide 108 or any material formed thereon, and on the dielectric sidewall portions 107, thereby building up an intrinsic stress, since respective bonds in the material being deposited may be re-arranged, causing a tensile or compressive stress, depending on the process conditions. Thus, the sub-layer 110A may finally create a respective stress, for instance, a tensile stress, with respect to the underlying material so that the corresponding "stress direction" may be substantially horizontal when material is deposited on the drain and source regions 103, while the corresponding stress direction at the dielectric sidewall structure 107 may be parallel to the corresponding surface area, thereby less efficiently contributing to a desired strain in the channel region 104. Similarly, the sub-layers 110B, 110C may be deposited on the respective preceding sub-layer, wherein the growth rate is substantially similar at the structure 107 and the drain and source regions 103 due to the highly conformal deposition conditions. Consequently, with increasing thickness of the layer 110, the amount of material having the "horizontal" stress in the vicinity of the channel region 104 may be increasingly "displaced" from the channel region due to highly conformal deposition behavior that results in a comparable growth rate of the "unwanted" vertical stress portion and the "desired" horizontal stress portion.

Figure 1B:
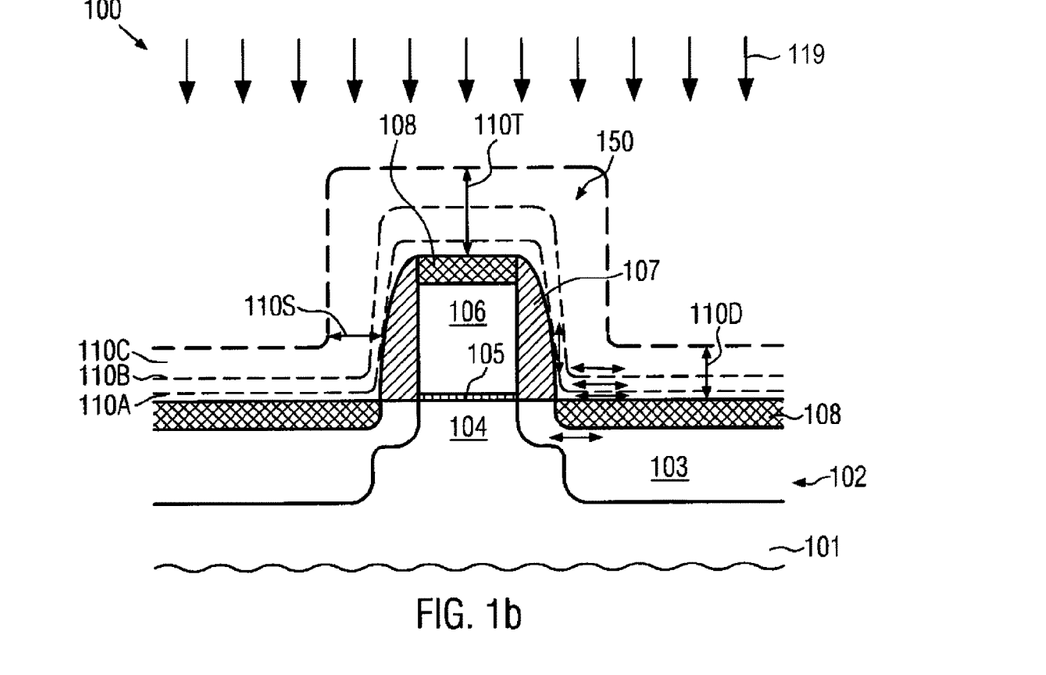
FIG. 1b schematically illustrates a cross-sectional view of the device of FIG. 1a during a deposition process exhibiting a highly non-conformal deposition behavior according to illustrative embodiments disclosed herein.

FIG. 1b schematically illustrates the semiconductor device 100 according to illustrative embodiments disclosed herein, wherein the deposition process for forming a stressed overlayer, indicated as 119, is, contrary to the conventional process 109, designed as a highly non-conformal deposition process in order to significantly reduce the deposition rate on vertical surface portions while providing a high degree of intrinsic stress. For example, the directionality of the respective ionic species in the plasma ambient may be increased, for instance, by reducing pressure in order to reduce scattering events, increasing the bias voltage and the like, wherein the per se non-conformal behavior of a PECVD process may be advantageously exploited so as to intentionally induce a non-conformal deposition rate. Consequently, the respective thickness 110S may be significantly less compared to the thickness 110T and may also be significantly less compared to a thickness 110D, corresponding to a thickness obtained above the drain and source regions 103. As is schematically illustrated in FIG. 1b, due to the reduced "vertical" deposition rate, the horizontal portions of the layer 110 may grow with an increased growth rate so that an increased amount of "horizontal" stress may be obtained in the vicinity of the sidewall structure 107, which may therefore result in an increased generation of strain in the channel region 104. Thus, the conformality may not be more than approximately 0.7 and may be significantly less, such as 0.5 and even less. That is, the thickness 110S may be approximately 0.7 times the thickness 110T or significantly less. Thus, by appropriately selecting process parameters for the plasma-based process 119, which may readily be accomplished on the basis of test runs and the like, for any appropriate and available PECVD process modules, a significant performance gain of the transistor 150 may be accomplished without contributing to additional process complexity compared to the conventional strategy as described with reference to FIG. 1a.

In other illustrative embodiments, the deposition rate on substantially vertical surface portions of the device 100 may be reduced on the basis of respective locally provided materials, such as polymer materials and the like, in order to provide a high degree of flexibility in selecting appropriate deposition parameters for the process 119. For instance, prior to performing the process 119, a respective material may be formed in a highly conformal manner and may be locally removed by, for instance, a highly anisotropic etch process on the basis of any appropriate plasma-based etch technique, thereby creating respective material residues, especially at vertical surface portions, such as lower portions of the dielectric sidewall structure 107. Thereafter, the process 119 may be performed, wherein the interaction of the material to be deposited and the previously generated residues may significantly reduce the deposition rate, for instance by reducing the surface mobility of the material being deposited during the process 119, thereby resulting in a significant non-conformal deposition behavior, even if similar process parameters may be used as in the deposition process 109.

Figure 1C:
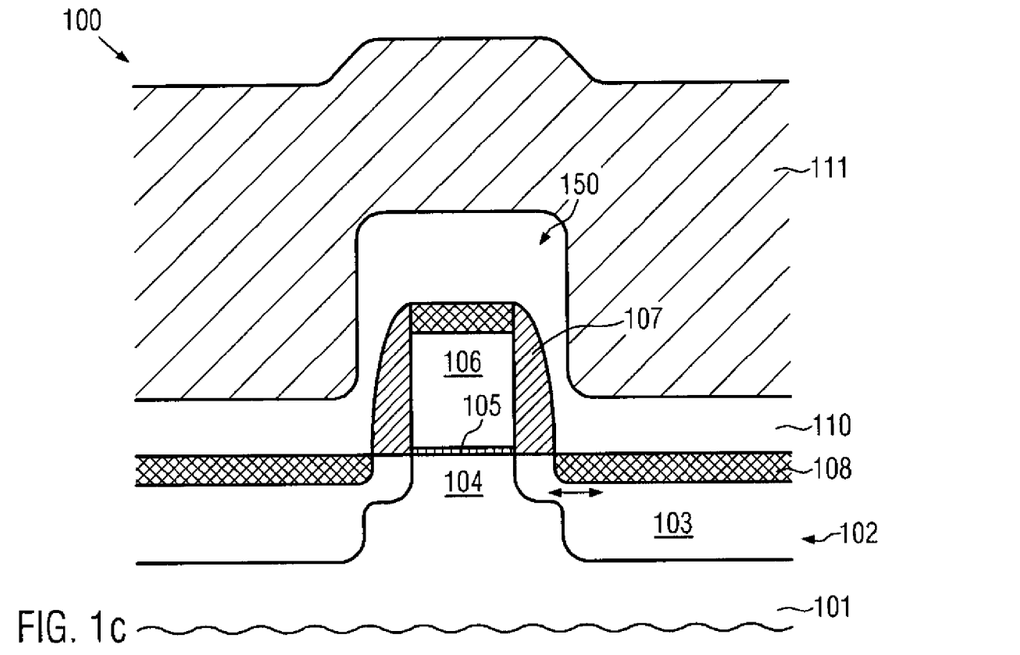
FIG. 1c schematically illustrates a cross-sectional view of the transistor of FIG. 1b in a further advanced manufacturing stage.

FIG. 1c schematically illustrates the semiconductor device 100 at a further advanced manufacturing stage. Here, an interlayer dielectric material 111, for instance silicon dioxide, or any other appropriate material, is formed above the stress-inducing layer 110, which, in some illustrative embodiments, may be provided in the form of a silicon nitride material exhibiting a high etch selectivity with respect to the interlayer dielectric material 111. The material 111 may be formed on the basis of well-established techniques, such as PECVD processes or CVD processes based on a high density plasma in order to provide the desired characteristics with respect to material integrity and the like. Thereafter, in some illustrative embodiments, the further processing may be continued on the basis of established techniques for forming contact openings in the interlayer dielectric material 111 by performing a corresponding lithography process and a subsequent anisotropic etch process, wherein the stress layer 110 may act as an efficient etch stop layer, which may be subsequently opened by appropriate etch techniques. Consequently, well-established conventional process recipes may be used, while nevertheless a significantly enhanced strain-inducing mechanism is provided by the highly non-conformal stress layer 110.

Figure 1D:
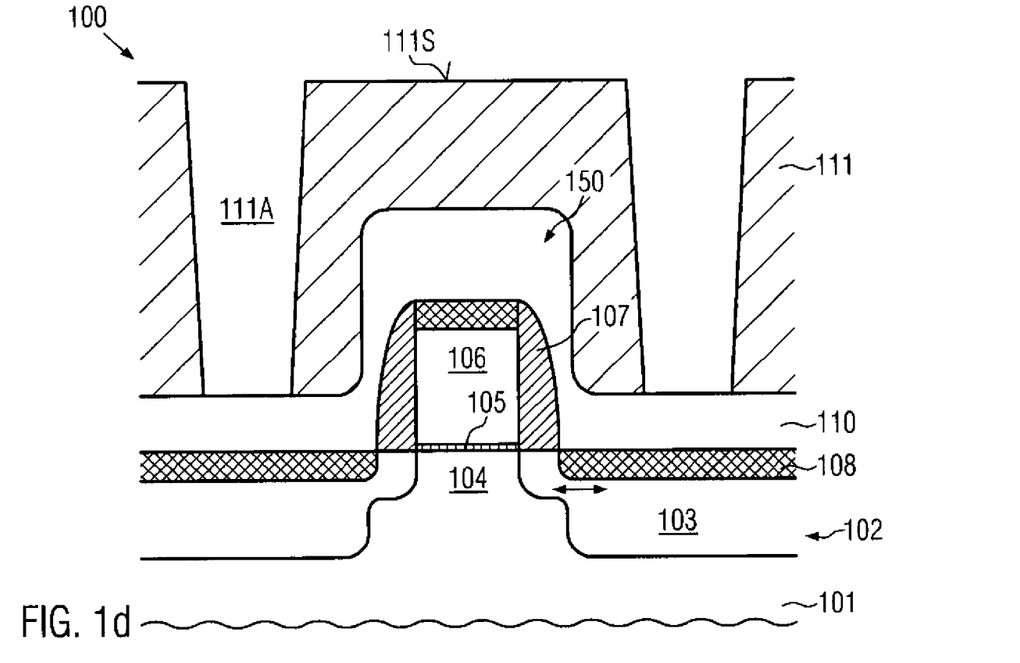
FIG. 1d schematically illustrates a cross-sectional view of the device in a further advanced manufacturing stage, wherein an interlayer dielectric material may be planarized according to other illustrative embodiments disclosed herein.

FIG. 1d schematically illustrates the semiconductor device 100 in accordance with further illustrative embodiments. Here, respective contact openings 111A are formed in the material 111, which may extend to the stress layer 110, acting as an etch stop layer, as previously explained. In this embodiment, the contact openings 111A may be formed on the basis of a lithography process, which may be performed on the basis of a highly planar surface 111S in order to enhance the efficiency of the respective lithography process. For example, in highly scaled semiconductor devices, the pronounced non-conformal surface topography, which may be even "amplified" by the non-conformal stress layer 110, may result in a corresponding topography of the interlayer dielectric material 111, which may have a negative impact on the subsequent photolithography process. For instance, a difference in resist thickness may result in respective inaccuracies during alignment and exposure of the corresponding resist material, which may, in turn, cause corresponding irregularities in the contact openings 111A, in the form of misalignment, variations in size and the like. Consequently, in one illustrative embodiment, a planarization process may be performed in order to provide the planar surface 111S. For this purpose, a chemical mechanical polishing (CMP) process may be performed, while additionally or alternatively, in other illustrative embodiments, a corresponding etch process may be performed on the basis of an appropriately provided planarization layer. In still other illustrative embodiments, any other planarization layer may be provided prior to the actual photolithography process, i.e., prior to the actual resist deposition, in order to provide a planarized surface topography at least during the exposure of the resist material and the subsequent etch process. Consequently, by performing a planarization process prior to patterning the openings 111A, the accuracy of the patterning process may be significantly enhanced, in particular when the surface topography is even more pronounced by the highly non-conformal layer 110.

With reference to FIGS. 1e-1i, further illustrative embodiments will now be described, in which the amount of "appropriately stressed" material of a stressed overlayer may be even further increased by more closely positioning the respective material to the gate electrode structure.

Figure 1E:
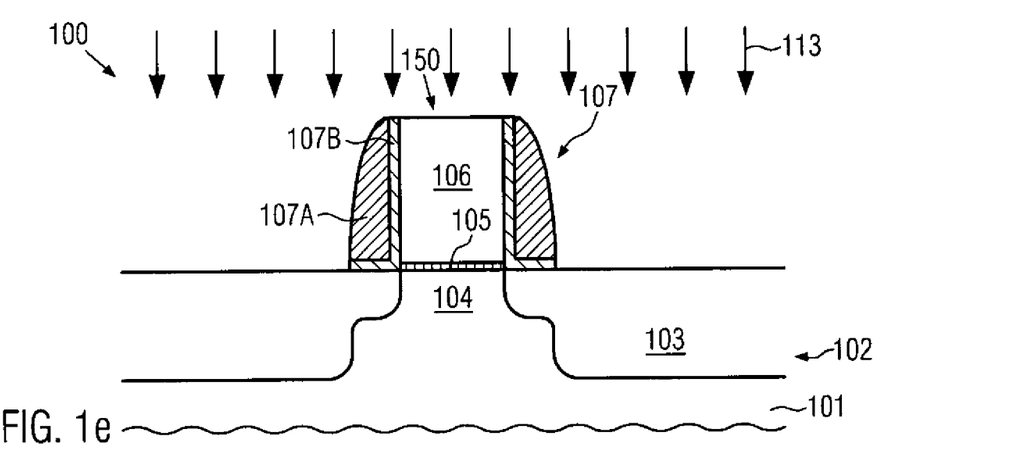
FIGS. 1e-1i schematically illustrate cross-sectional views of a transistor element during various manufacturing stages for positioning a stressed material of an overlayer more closely to the channel region according to still other illustrative embodiments disclosed herein.

FIG. 1e schematically illustrates the semiconductor device at an early manufacturing stage. Here, the gate electrode 106 has formed thereon the sidewall spacer structure 107, which may comprise a liner 107B, for instance comprised of silicon dioxide, silicon nitride and the like, and a spacer 107A, for instance comprised of silicon nitride, silicon dioxide and the like. It should be appreciated that the spacer structure 107 may comprise a plurality of individual spacer elements, such as the spacer 107A, in combination with one or more respective liners, such as the liner 107B, depending on the device requirements with respect to dopant profiles, silicidation regimes and the like. Furthermore, the device 100 may be exposed to an etch ambient 113 designed to remove the spacer 107A selectively to the liner 107B and the gate electrode 106 and the drain and source regions 103. For instance, the etch ambient 113 may be designed as a wet chemical etch process, for instance based on hot phosphoric acid, when the spacer 107A is comprised of silicon nitride.

Figure 1F:
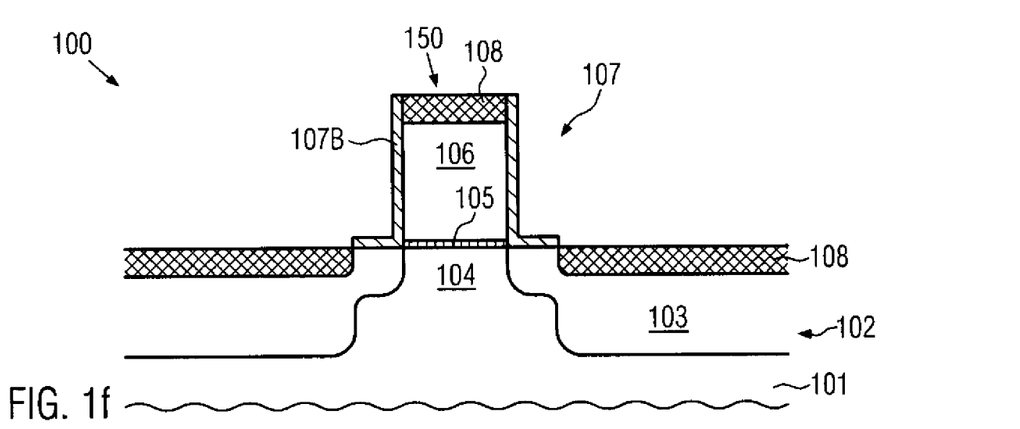

FIG. 1f schematically illustrates the semiconductor device 100 after the removal of the sidewall spacer 107A, thereby leaving the L-shaped liner 107B. Furthermore, the respective metal silicide regions 108 are formed in the drain and source regions 103 and in the gate electrode 106. During the corresponding metal silicide processing, the L-shaped liner 107B may be efficiently used as a silicidation mask to obtain the desired offset of the regions 108 within the drain and source regions 103 with respect to the channel region 104.

Figure 1G:
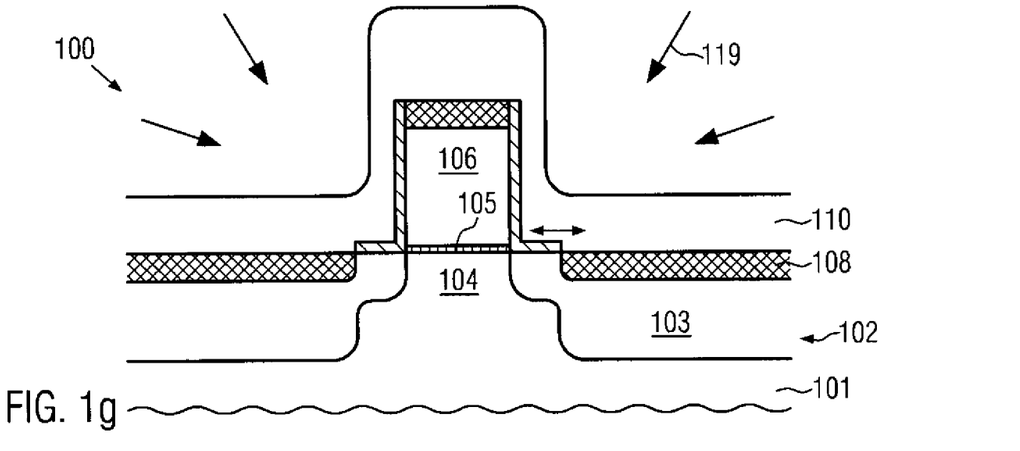

FIG. 1g schematically illustrates the device 100 during the non-conformal deposition process 119 for forming the non-conformal stress layer 110, wherein, for a given deposition recipe, the non-conformality may be even further enhanced due to the substantially vertical dielectric sidewall structure provided by the liner 107B. Furthermore, the corresponding "horizontal" portion of the layer 110 having the desired horizontally acting stress component may therefore be increased, since the corresponding horizontal portions may be positioned more closely to the channel region 104, thereby increasing even more the efficiency of the respective strain-inducing mechanism. Thereafter, the further processing may be continued as is described above with respect to FIGS. 1c and 1d.

Figure 1H:
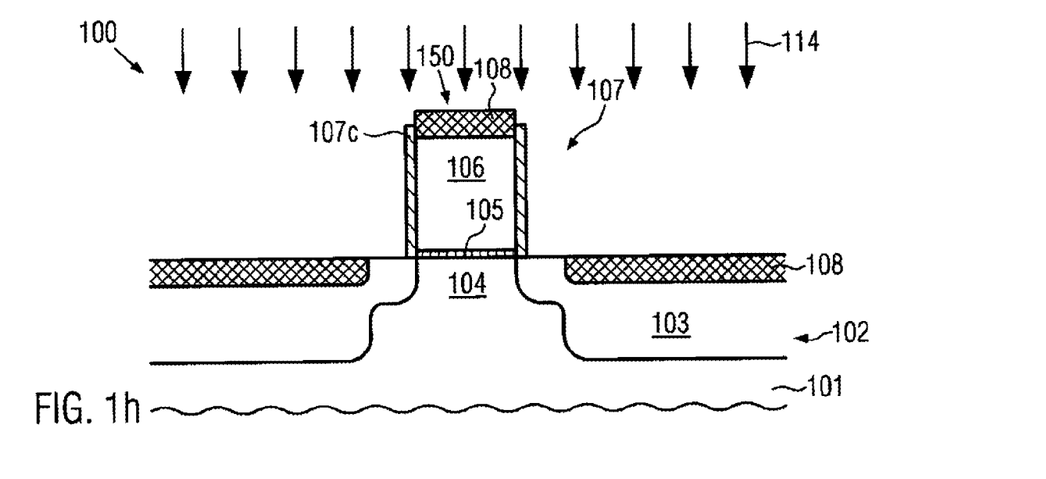

FIG. 1h schematically illustrates the semiconductor device 100 after the selective removal of the spacer element 107A, as shown in FIG. 1e, and after the formation of the respective metal silicide regions 108 on the basis of the L-shaped liner 107B as illustrated in FIG. 1f. Thereafter, the device 100 may be subjected to a substantially anisotropic etch process 114 in order to remove the horizontal portion of the L-shaped liner 107B, thereby forming a respective offset liner 107C. Appropriate process recipes for a variety of materials, such as silicon dioxide, are well established in the art and may be used for this purpose. It should be appreciated that damage of the process 114 in the respective metal silicide regions 108 may be considered tolerable due to the reduced thickness of the liner 107B, which may range from a few nm to 10 or more nm.

Figure 1I:
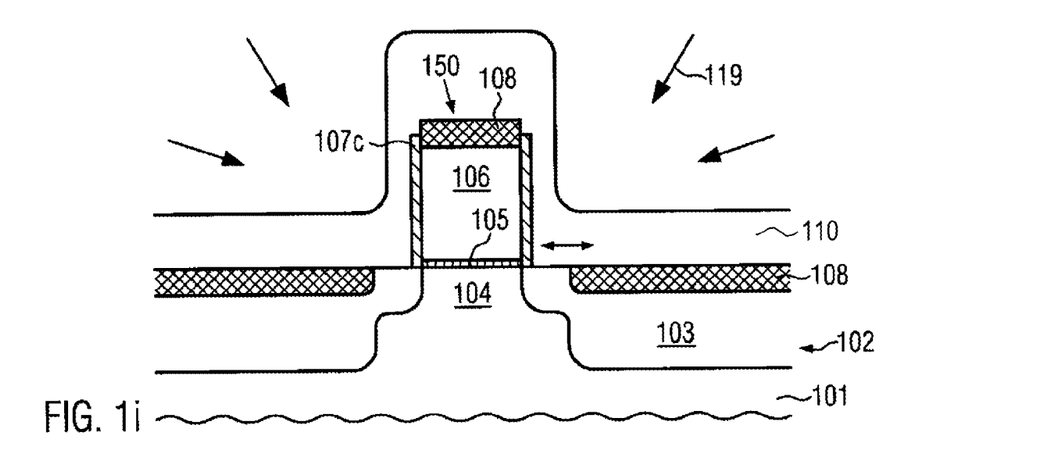

FIG. 1i schematically illustrates the device 100 during the non-conformal deposition process 119 for forming the stressed overlayer 110, wherein, in this case, the respective "horizontal" component of the layer 110 may be substantially directly formed on exposed portions of the drain and source regions 103, which may even further enhance the efficiency of the corresponding strain-inducing mechanism.

With reference to FIGS. 2a-2d, further illustrative embodiments will now be described in more detail, in which different transistor elements may receive a non-conformal stressed overlayer having a different type of intrinsic stress.

Figure 2A:
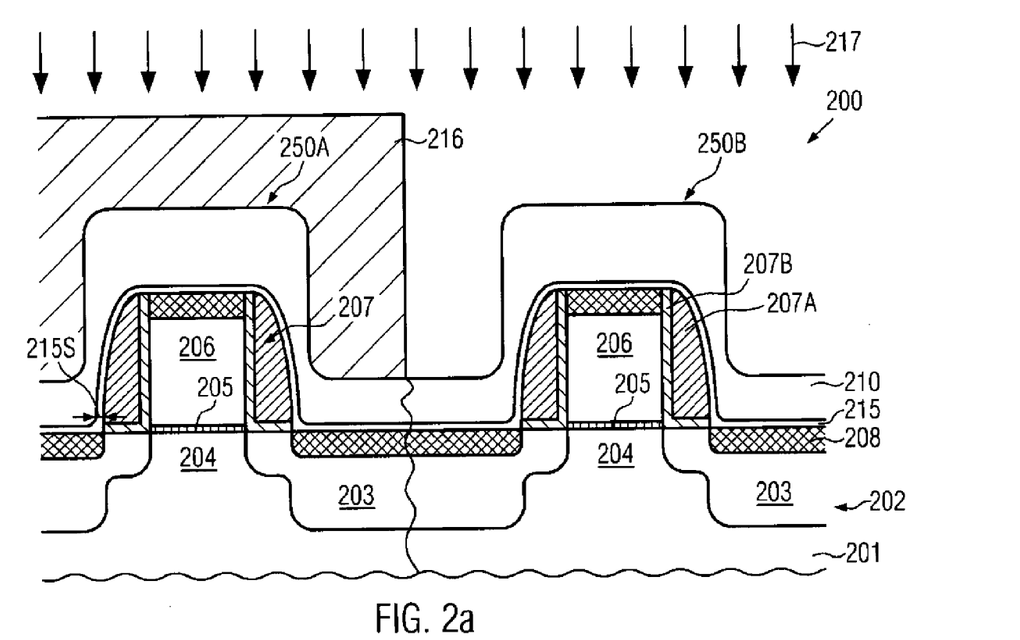
FIGS. 2a-2d schematically illustrate cross-sectional views of a semiconductor device including different types of transistors receiving differently stressed overlayers according to further illustrative embodiments disclosed herein.

FIG. 2a schematically illustrates a semiconductor device 200 comprising a first transistor 250A and a second transistor 250B formed above a substrate 201 comprising a semiconductor layer 202. With respect to the substrate 201 and the semiconductor layer 202, the same criteria apply as previously explained with reference to the devices 100. It should be appreciated that the transistors 250A, 250B may represent transistors of different conductivity type, such as P-channel transistors and N-channel transistors, respectively. Although the transistors 250A, 250B may differ in their configuration with respect to transistor width dimension, the gate length and the like, in the following, the same components are shown for each of the transistors 250A, 250B without intending to restrict the present invention to any specific transistor configuration. The transistors 250A, 250B may comprise a gate electrode 206, a gate insulation layer 205, a gate sidewall structure 207 and respective drain and source regions 203. Furthermore, respective metal silicide regions 208 may be provided, wherein, with respect to these components, the same criteria apply as previously explained with reference to the device 100. In this context, it should be appreciated, however, that respective components of the transistor 250A, 250B may differ significantly. For instance, the drain and the source regions 203 of the transistor 250B may be formed on the basis of a different dopant species compared to the respective regions of the transistor 250A. Furthermore, the device 200 may have formed an etch stop layer 215 above the transistors 250A, 250B followed by a non-conformal stress layer 210. For example, the etch stop layer 215 may be comprised of silicon dioxide, while the non-conformal stress layer 210 may be comprised of silicon nitride. The layer 210 may exhibit a high intrinsic stress selected to increase the strain in the respective channel region 204 of one of the transistors 250A, 250B. In the present example, the intrinsic stress of the layer 210 is selected so as to enhance performance of the transistor 250A. For this purpose, a resist mask or any other etch mask 216 may be provided to cover the transistor 250A while exposing the transistor 250B, i.e., the portion of the stress layer 210 located above the transistor 250B.

The transistors 250A, 250B of the semiconductor device 200 may be formed on the basis of the processes as previously described with reference to the devices 100. Thereafter, the etch stop layer 215 may be formed, in some illustrative embodiments, on the basis of well-established recipes, while, in other illustrative embodiments, the layer 215 may be formed on the basis of a non-conformal PECVD technique, thereby reducing the thickness of the corresponding layer 215 at substantially vertical device portions. That is, the corresponding thickness 215S may be less compared to the thickness at horizontal portions thereof. As previously explained, a corresponding non-conformal deposition behavior may already be established in plasma-enhanced techniques by appropriately selecting the respective deposition parameters, such as ion bombardment, surface mobility and the like. Thereafter, the stressed layer 210 may be formed on the basis of the process as previously described with reference to the deposition process 119 in order to obtain a highly non-conformal deposition behavior. Thereafter, the etch mask 216 may be formed, for instance on the basis of photolithography, and subsequently the device 200 may be exposed to an etch process 217 for removing the exposed portion of the layer 210 selectively to the etch stop layer 215 on the basis of the mask 216. For example, highly selective wet etch processes on the basis of hot phosphoric acid and the like are readily available, when the layer 210 is substantially comprised of silicon nitride. During the etch process 217, the significantly reduced thickness 215S of the etch stop layer 215 at vertical surface portions may result in a significant etch damage and etch attack of the sidewall structure 207, thereby resulting in a significant material removal which may finally result in a complete removal of the spacer element 207A selectively to the liner 207B in the second transistor 250B. In other illustrative embodiments, when the etch stop layer 215 is provided as a substantially conformal layer, the exposed portion of the layer 210 may be removed substantially without affecting the spacer element 207A.

Figure 2B:
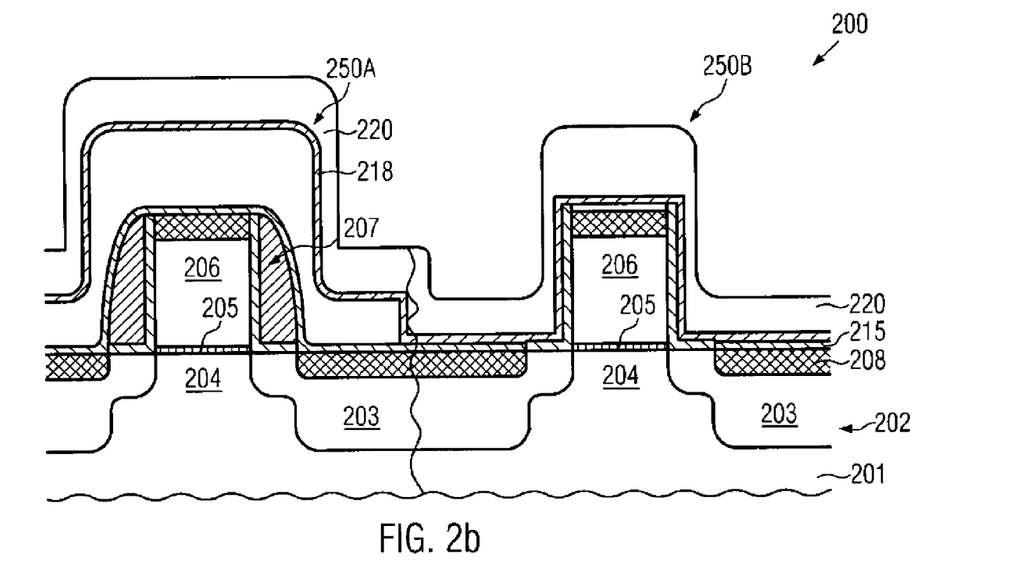

FIG. 2b schematically illustrates the device 200 at a further advanced manufacturing stage, after the etch process 217 and after the removal of the etch mask 216. Furthermore, a further etch stop layer or an etch indicator layer 218 may be formed on the stress layer 210 and above the transistor 250B, wherein, in the embodiment shown, the spacer structure 207 may be substantially reduced to the respective liner 207B. Moreover, a second stressed overlayer 220 having a high intrinsic stress as is appropriate for enhancing the performance of the transistor 250B may be formed on the etch stop layer or etch indicator layer 218.

The device 200 as shown in FIG. 2b may be formed by depositing the layer 218 on the basis of well-established techniques, followed by an appropriate non-conformal deposition process for forming the layer 220 having a high intrinsic stress that is different from the intrinsic stress of the layer 210. As previously explained, due to the highly non-conformal behavior and, as shown, due to the missing spacer elements 207A, a corresponding high amount of "effective" stressed material may be positioned close to the channel region 204 of the transistor 250B. Thus, in this case, the additional materials of the layers 215 and 218, provided at horizontal portions of the transistor 250B, may be efficiently compensated for or over-compensated for by removing the respective sidewall spacer elements 207A. Thereafter, the unwanted portion of the layer 220 formed above the transistor 250A may be removed on the basis of a respectively formed etch mask, wherein a control of the corresponding etch process may be accomplished on the basis of the layer 218.

Figure 2C:
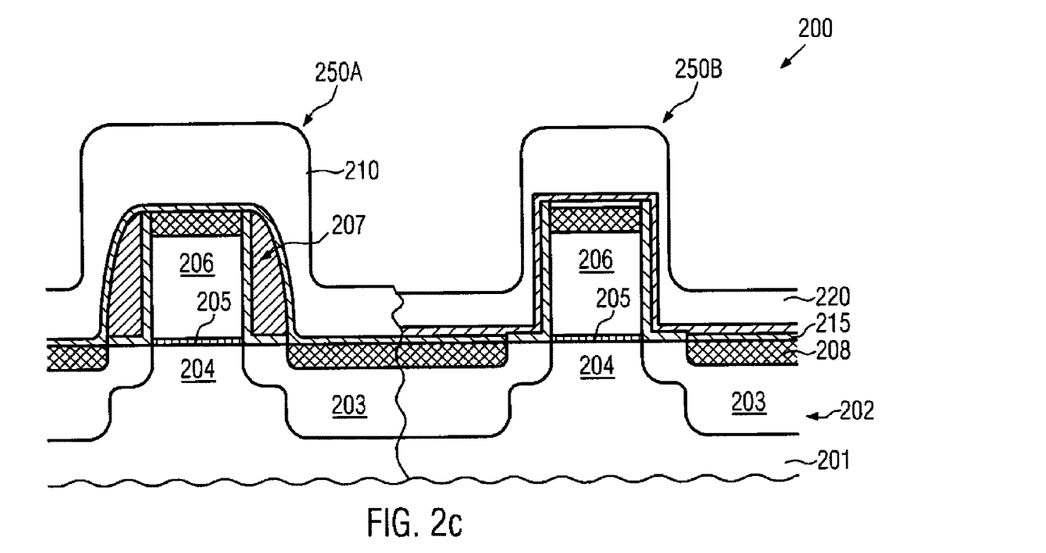

FIG. 2c schematically illustrates the device 200 after the above-described process sequence. Hence, the transistor 250A comprises the highly non-conformal stressed overlayer 210, while the second transistor 250B may comprise the non-conformal stressed layer 220, wherein, in the embodiment shown, the corresponding stress material of the layer 220 may be positioned close to the channel region 204 due to the removed spacer elements 207A. Consequently, an efficient strain-inducing mechanism may be provided for different types of transistors, wherein a high degree of compatibility with respect to conventional strategies may be maintained, for instance, with respect to spacer techniques, wherein, nevertheless, a corresponding increased thickness of etch stop layers, i.e., the layers 215 and 218, may be compensated for by removing the spacer element 207A of the transistor 250B substantially without adding any process complexity.

Figure 2D:
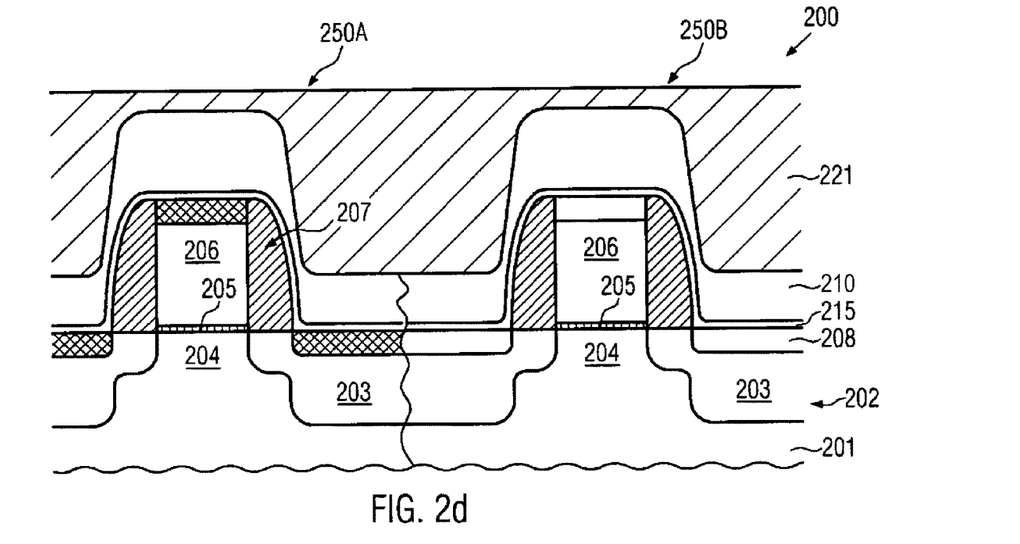

FIG. 2d schematically illustrates the device 200 according to a further illustrative embodiment, wherein, after forming the highly non-conformal stress layer 210 above the transistors 250A and 250B, a corresponding planarization layer 221 may be provided in order to enhance the corresponding lithography process for forming the etch mask 216, when provided in the form of a resist mask. For instance, the planarization layer 221 may be provided in the form of any appropriate polymer material, which may be applied by spin-on techniques or any other appropriate non-conformal deposition technique so as to substantially compensate for the pronounced surface topography, which may be enhanced by the corresponding non-conformal stress layer 210. Thus, based on the planarization layer 221, the corresponding lithography process may be performed with high accuracy, thereby enhancing the overall performance of the further manufacturing processes for removing an unwanted portion of the layer 210 and for providing a highly stressed second layer as is previously explained with reference to FIG. 2b.

As a result, the subject matter disclosed herein provides a technique for increasing the efficiency of the strain-inducing mechanism provided by a stressed overlayer, such as a contact etch stop layer, in that the corresponding layer is deposited with a high degree of non-conformality, thereby increasing the amount of stress material that effectively contributes to the respective strain in the channel region. The highly non-conformal behavior may be accomplished by appropriately selecting deposition parameters, for instance in PECVD techniques, and/or by selectively modifying the surface characteristics of substantially vertical device surfaces prior to depositing the highly stressed material. Moreover, in some illustrative embodiments, the pronounced surface topography of the device after providing the highly non-conformal stressed layer may be reduced by performing one or more planarization processes, thereby providing enhanced accuracy during the further patterning of contact openings, removing unwanted portions of stressed layers and the like. Consequently, increased strain transfer efficiency may be provided, while a high degree of compatibility with conventional processes may be maintained. Thus, for otherwise identical stress conditions, a significant increase of transistor performance may be accomplished.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
depositing a stress-inducing layer having a first material composition above a gate electrode structure having a dielectric sidewall portion and drain and source regions of a field effect transistor by a non-conformal deposition process, said non-conformal deposition process producing said stress-inducing layer with a conformality ratio of approximately 70 percent or less with respect to said dielectric sidewall portion and a top surface of said gate electrode structure;
forming an interlayer dielectric material of a second material composition above said stress-inducing layer; and
forming contact openings in said interlayer dielectric material using said stress-inducing layer as an etch stop layer.

2. The method of claim 1, further comprising removing a sidewall spacer from said gate electrode structure prior to depositing said stress-inducing layer.

3. The method of claim 2, wherein removing said sidewall spacer comprises etching said sidewall spacer selectively to a liner separating said sidewall spacer from a surface of said drain and source regions and a sidewall of a gate electrode of said gate electrode structure.

4. The method of claim 3, further comprising removing a portion of said liner formed above said surface of said drain and source regions, wherein said portion is located adjacent said gate electrode structure.

5. The method of claim 1, wherein said stress-inducing layer has an intrinsic stress of approximately 1 Giga Pascal or higher.

6. The method of claim 1, wherein said gate electrode structure comprises a gate electrode having a gate length of approximately 90 nm or less.

7. The method of claim 1, wherein said conformality ratio of said stress-inducing layer is approximately 50 percent or less.

8. The method of claim 1, wherein forming said interlayer dielectric material comprises performing at least one planarization process prior to forming said contact openings.

9. A method, comprising:
forming a first non-conformal stress-inducing layer above a first transistor, said first non-conformal stress-inducing layer having a first type of intrinsic stress; and
forming a second non-conformal stress-inducing layer above a second transistor, said second non-conformal stress-inducing layer having a second type of intrinsic stress other than said first type of intrinsic stress, said first and second stress-inducing layers having a conformality ratio of 70 percent or less.

10. The method of claim 9, wherein a conformality ratio of said first and second stress-inducing layers is approximately 50 percent or less.

11. The method of claim 9, wherein forming said first stress-inducing layer comprises forming a liner above said first and second transistors, depositing said first stress-inducing layer above said liner and removing a portion of said first stress-inducing layer located above said second transistor, using said liner as an etch stop layer.

12. The method of claim 11, wherein said liner is formed by a non-conformal deposition process.

13. The method of claim 11, further comprising planarizing a surface topography of said first stress-inducing layer prior to removing said portion thereof.

14. The method of claim 11, wherein forming said second stress-inducing layer comprises depositing said second stress-inducing layer above said first and second transistors and removing a portion of said second stress-inducing layer that is located above said first transistor.

15. The method of claim 14, further comprising forming contact openings in an interlayer dielectric material formed above said first and second stress-inducing layers by using a planarization process for planarizing a surface topography of said interlayer dielectric material prior to forming said contact openings.

16. A method, comprising:
   forming a first transistor and a second transistor above a semiconductor layer formed above a semiconductor substrate;
   forming a liner above said first transistor and said second transistor;
   forming a first non-conformal stress-inducing layer above said liner, said first non-conformal stress-inducing layer having a first type of intrinsic stress and a first conformality ratio of 70 percent or less;
   removing a portion of said first non-conformal stress-inducing layer located above said second transistor using said liner as an etch stop layer;
   forming a second non-conformal stress-inducing layer above said second transistor, said second non-conformal stress-inducing layer having a second type of intrinsic stress other than said first type of intrinsic stress and a second conformality ratio of 70 percent or less.

17. The method of claim 16, wherein said first conformality ratio of said first stress-inducing layer is approximately 50 percent or less.

18. The method of claim 16, wherein said second conformality ratio of said second stress-inducing layer is approximately 50 percent or less.

19. The method of claim 16, wherein said liner is formed by a non-conformal deposition process.

20. The method of claim 16, further comprising planarizing a surface topography of said first stress-inducing layer prior to removing said portion thereof.

21. The method of claim 16, wherein forming said second stress-inducing layer comprises depositing said second stress-inducing layer above said first and second transistors and removing a portion of said second stress-inducing layer that is located above said first transistor.

22. The method of claim 21, further comprising forming contact openings in an interlayer dielectric material formed above said first and second stress-inducing layers by using a planarization process for planarizing a surface topography of said interlayer dielectric material prior to forming said contact openings.

* * * * *